United States Patent [19]

Brahmbhatt

[11] Patent Number: 5,646,886
[45] Date of Patent: Jul. 8, 1997

[54] FLASH MEMORY HAVING SEGMENTED ARRAY FOR IMPROVED OPERATION

[75] Inventor: Dhaval J. Brahmbhatt, San Jose, Calif.

[73] Assignee: National Semiconductor Corporation, Santa Clara, Calif.

[21] Appl. No.: 449,564

[22] Filed: May 24, 1995

[51] Int. Cl.$^6$ ................................................ G11C 11/40
[52] U.S. Cl. .......................... 365/185.16; 365/185.05
[58] Field of Search ...................... 365/185.16, 185.05, 365/185.25, 185.11, 185.33, 185.29

[56] References Cited

U.S. PATENT DOCUMENTS

| | | | |
|---|---|---|---|
| 5,023,681 | 6/1991 | Ha | 357/23.5 |
| 5,241,497 | 8/1993 | Komarek | 365/104 |
| 5,295,105 | 3/1994 | Atsumi | 365/218 |
| 5,313,432 | 5/1994 | Lin et al. | 365/230.06 |
| 5,319,593 | 6/1994 | Wolstenholme | 365/185 |
| 5,327,378 | 7/1994 | Kazerounian | 365/185 |
| 5,331,592 | 7/1994 | Yamagata | 365/185.16 |
| 5,379,254 | 1/1995 | Chang | 365/185 |
| 5,406,521 | 4/1995 | Hara | 365/185.29 |

FOREIGN PATENT DOCUMENTS

| | | | |
|---|---|---|---|
| 0 461 764 A2 | 12/1991 | European Pat. Off. | H01L 27/115 |
| 0 529 862 A2 | 3/1993 | European Pat. Off. | G11C 17/10 |

OTHER PUBLICATIONS

Document No. Appl. No. 08/307,340, Filing Date Sep. 16, 1994, Name Brahmbatt, Dhaval.

Primary Examiner—A. Zarabian
Attorney, Agent, or Firm—Limbach & Limbach L.L.P.

[57] ABSTRACT

The drain bit line capacitance of a segmented alternate-metal virtual-ground (AMG) flash memory array is reduced by connecting the virtual or noncontinuous bit lines of the array to a drain voltage via select transistors that are not connected to the continuous bit lines that extend through each of the segments of the array.

20 Claims, 8 Drawing Sheets

FLASH MEMORY HAVING SEGMENTED ARRAY FOR IMPROVED OPERATION

BACKGROUND OF THE INVENTION

1. Field of the Invention

The present invention relates generally to semiconductor memories and in particular to a flash memory system having improved characteristics.

2. Background Art

Semiconductor memories have been developed which are non-volatile and can be electrically programmed and erased. Electrically Programmable Read Only Memories (EPROM) exist which provide non-volatile operation and which have a small cell area so that data may be stored at a relatively high density. However, EPROMs are erased in bulk by exposing the entire cell array to U.V. light. Thus, these devices must be entirely reprogrammed every time an erasure occurs.

By way of further example, Electrically Erasable Programmable Read Only Memories (EEPROM) exist which are non-volatile and which can be electrically erased on a byte-by-byte basis. However, EEPROM devices have various shortcomings, including the lack of ability to store date at higher densities. This is due largely to the fact that each memory cell must have an associated select transistor. Thus, EEPROM devices are typically not capable of storing data at high densities.

Flash memory cells have also been developed which are non-volatile and which are capable of storing data at a relatively high density. However, most flash memory arrays are bulk erased although certain arrays permit erasure of less than the entire array. In addition, many flash memory arrays have reduced endurance, i.e., the ability to withstand repeated program-erase cycles, as compared to other types of semiconductor memory cells. Further, most large flash memory arrays have severe speed limitations during read operations due to the parasitic capacitance of the long bit lines used in the arrays.

The foregoing advantages and limitations of flash memory cells can best be illustrated by reference to the drawings. FIG. 1A shows a simplified typical conventional flash memory cell, generally designated by the numeral 10. Cell 10 is formed in an N type substrate 12. A P type well 14 is formed in substrate 12 followed by the formation of an N+ type region 16 in the well which functions as the source and another N+ type region which functions as the drain. The region 14a in the well 14 intermediate the source 16 and drain 18 regions functions as the cell channel region.

A polysilicon floating gate 20 is disposed over the channel region 14a and is insulated from the channel region by a thin gate oxide 22. This thin oxide, which is typically about 100 Å, is a key distinguishing feature of a flash memory cell. A polysilicon control gate 24 is disposed over the floating gate 20 and is insulated from the floating gate by an interpoly dielectric layer 26.

FIG. 1A also illustrates typical voltages which can be applied to cell 10 in order to program the cell. A relatively large positive voltage Vpp, +12 volts for example, is applied to the control gate 24. An intermediate voltage, +6 volts for example, is applied to the drain region 18 and the source region 16 is grounded. The P well 18 is biased to ground level by way of a P+ contact 28.

The large positive voltage applied to the control gate 24 causes hot electrons to be injected from the source region 16 towards the drain region 18. Some electrons pass through the gate oxide 22 in that portion of the channel region 42a near the drain region 18 and into the floating gate 20. As will be explained later, the presence of the negative charge on the floating gate alters the threshold voltage of the cell thereby indicating that the cell has been programmed. Cell 10 will remain programmed until it is erased as depicted in FIG. 1B.

Referring to FIG. 1B, this figure shows typical voltages for erasing cell 10. The source region 16 and the drain region 18 are left open (floating) and an intermediate positive voltage, +3 volts for example, is applied to the P-well 14. A relatively large negative voltage Vee, typically −15 volts, is applied to the control gate 24. These voltages cause electrons to be transferred from the floating gate 20 and through the thin gate oxide 22 and into the positive P-well along the channel 42a. The predominate mechanism for erasing in the manner previously described is commonly referred to as cold electron injection or Fowler-Nordheim tunneling. Other types of conventional erasing sequences result in tunneling concentrated in the vicinity of the drain region 18.

It is known that the endurance of the flash memory cell can be improved by erasing and programming the cells at different locations. The exemplary configuration of FIG. 1A results in programming near the drain region 18. The exemplary configuration of FIG. 1B results in erasure over the entire channel 14a so that erasure and programming do not completely occur at the same location. However, as just noted, other exemplary erase configurations would result in the majority of the erase and programming mechanism taking place near the drain region, thereby resulting in reduced cell durability.

FIG. 1C depicts the manner in which cell 10 is read. The drain region 18 is connected to an intermediate level positive voltage, such as +3 volts, by way of a load impedance represented by resistors 30A and 30B. The resistors divide down the +3 volts to approximately +1.5 volts at the drain region 18. An intermediate positive voltage, such as +3 volts, is applied to the control electrode 24 and the source region 16 is grounded.

In the event the cell 10 has not been previously programmed, the cell will have an erased threshold voltage VtErase which is relatively low. The voltage applied to the cell will be sufficient to invert the channel 14a, that is, to render the cell 10 conductive. A current will be drawn through load 30A/30B and will produce a voltage at the inverting input of a sense amplifier 32, also connected to the drain region 18, which is less than the +1.5 volts present when the cell is non-conductive at of a reference voltage VRef. The output of the sense amplifier will change state thereby indicating that the cell had not been programmed but, rather, was in the erased state.

In the event cell 10 had been previously programmed, the negative charge present on the floating gate 20 due to the presence of electrons will increase the threshold voltage of the cell. The increased threshold voltage, referred to as VtWrite, will prevent the cell 10 from becoming conductive when the voltages of FIG. 1C are applied. Thus, the voltage applied to the inverting input of amplifier 32 will remain high at +1.5 volts. Reference voltage Vref is selected to be less than +1.5 volts so the amplifier output will remain unchanged indicating that the cell had been programmed.

FIG. 2 shows a conventional flash memory array of a memory system with control circuitry deleted. The array, which has a capacity of 1 Megabit, is comprised of N channel cells 10 as depicted in FIGS. 1A–1C. The floating gate cells 10 are arranged in 1024 rows and 1024 columns to form a 1 megabit array. In the exemplary array, all of the cells 10 have their source regions connected to a circuit common. All of the cells 10 located in a particular column have their drain regions connected to a common bit line BL1–BL1024. The bit lines may be implemented by way of a metal bit line or by way of a buried doped semiconductor line. All of the cells 10 located in a particular row have their control gates connected to a common word line WL1–WL1024. The word lines are typically implemented by way of a doped polysilicon lines.

The manner in which the cells 10 are erased, programmed and read is well known in the art and is similar to that described in connection with FIGS. 1A–1C. Since all of the sources of the cells 10 are connected together, all cells 10 of the array must be erased together in this arrangement. As previously noted, there are flash cell arrays which do permit blocks of cells to be erases but it does not appear that any flash cell arrays permit individual cells to be erased if desired.

When the individual cells 10 of the FIG. 2 array are read, a positive voltage is applied to the selected bit line BLN (the bit line connected to the target cell), with the deselected bit lines being grounded. During consecutive read cycles, it is invariably necessary to rapidly swing the voltage of the bit lines BLN between ground and the positive voltage used in read operations.

Since memory program and memory erase operations require at least an order of magnitude more time than do memory read operations, flash memory devices are primarily intended to function as read mostly devices. That is, once the device has been programmed, it is anticipated that almost all of the subsequent operations will be read operations. Thus, the speed of memory read operations essentially determines the overall speed of the memory for all practical purposes.

One of the primary limitations on reading speed is the inherent capacitance associated with the memory bit lines BLN. Some of this capacitance is attributable to the capacitive coupling between the associated bit line and the surrounding structure, with the remainder of the capacitance being attributable to the capacitance of the drain region of all of the cells 10 connected to the bit line BLN. This capacitance is particularly large in the exemplary FIG. 2 array in that the bit line extends the full length of the array and is connected to each of the 1024 cells located in the associated array column.

The delays associated with the capacitance are exacerbated when the bit lines have a significant resistance. The resultant large RC time constant significantly impedes the speed of memory read operations, particularly when the bit line BLN is implemented in the form of a doped semiconductor line, either diffused or ion implanted, rather than a metal line.

One approach to overcoming such speed limitation is to use memory cells that produce large currents when read. These large currents decrease the time necessary to charge and discharge the bit lines. However, large cell currents inherently require large geometry cells. Large geometry cells obviously result in a decrease in the number of cells which can be implemented in an integrated memory device and further result in the undesirable parasitic capacitance previously discussed.

It is also known that the effects of bit line capacitance can be reduced by segmenting the bit line. By way of example, FIG. 3 shows part of a prior art memory cell array utilizing a segmenting technique. Only part of a single array column is depicted, namely, a column associated with a bit line BL1.

The array includes a Segment 1 comprising rows 1–32 of cells 10 and a Segment 2 comprising rows 33–64 of the cells. Other segments can be added as required and the size of the segments can be increased to include 64, 128, etc. rows in each segment. Further, the number of columns present in each segment can be increased.

Each segment is connected to the associated bit line BL1 by a segment select transistor, with Segment 1 being connected by way of transistor 12 and Segment 2 connected by way of transistor 14. Depending upon the read address, only one of the segments is selected at one time by way of appropriate segment select transistors SS1, SS2, etc. Thus, the total capacitance associated with the bit lines is substantially reduced. By way of example, if Segment 1 is selected, select transistor 12 is made active with the remaining select transistors being maintained off. Thus, only the capacitance associated with the drains of cells 1–32 plus the additional capacitance of transistors SS1, SS2, SS3–SSN must be charged and discharged during the read operation. Bit line BL1 still extends the full length of the array, but the capacitance attributable to the bit line alone is significantly smaller than that associated with the drain regions of the cells 10 of the non-selected segments.

There has also been a tendency in the prior art to reduce the area required of a memory array by alternating metal bit lines and diffused semiconductor bit lines. Since metal bit lines require much more area to implement than do semiconductor bit lines, the use of alternating metal and semiconductor lines reduces the area of each cell significantly. Such arrays, which are used in EPROMs, are sometimes referred to as alternate metal virtual ground or AMG arrays.

FIG. 4 shows an exemplary prior art AMG array of memory cells 10. The array includes multiple segments including a Segment 1 comprising rows 1–64 and columns of cells. An actual array would include many more columns. The next segment is Segment 2 and includes rows 65–128, with only one row being depicted. Typically, there would be additional segments in the AMG array.

The cells 10 in a row are arranged in pairs, with each pair sharing a common source region. By way of example, adjacent cells 10A and 10B located in the row associated with word line WL2 include a common N type source region. Cell pair 10E and 10F located in the row associated with word line WL3 also share a common N type source region diffusion which is connected by a buried N type semiconductor bit line BLB to the common source region diffusion of cells 10A and 10B. Similarly, cells 10B and 10C in adjacent cell pairs have a common N type drain region diffusion which is connected by a buried N type semiconductor bit line BL2 to the common drain region of cells 10F and 10G.

Alternate bit lines, including line BL1, BL2 and BL3 are each connected in parallel with an overlying metal track (not shown). The metal tracks are connected to the buried bit lines by way of contacts 16 located at the top and bottom of each segment.

Each segment of the conventional AMG array has an associated set of segment select transistors SSN which are controlled by complementary segment select signals SN and $\overline{SN}$. The segment select signals are controlled by address decoding circuitry so that only one of the array segments will be enabled during a read or write operation. When Segment 1 is enabled, a selected one of signals S1 and $\overline{S1}$ is active and the other segments select signals SN and $\overline{SN}$ are inactive. Similar segment select transistors are located on the opposite side of each segment and are connected in parallel with the transistors located at the top of the array and are driven by the same select signal SN and $\overline{SN}$. This parallel arrangement of segment select transistors at opposite sides of the bit lines tends to reduce the effect of bit line resistance by one-half.

Operation of the AMG array can best be described by way of example. Assume that cell 10B is to be read. Control circuitry (not depicted) will cause a positive voltage to be applied to bit line BL2 by way of a load circuitry (also not depicted). This voltage will thus be applied directly to the drain region of cell 10B. The control circuitry will also ground bit line BL1. The remaining bit lines BLN are also maintained at the same positive voltage as bit line BL2. Segment select signal $\overline{S1}$ will be active (high) and S1, by definition will be inactive. Thus, segment select transistor SS1 will be rendered conductive and transistor $\overline{SS1}$ will remain off. Conductive transistor SS1 will connect the source region of cell 10B to grounded bit line BL1. In addition, the control circuitry will connect a positive voltage to word line WL2.

Assuming that cell 10B is in an erased state, the above conditions will render cell 10B conductive. Current will flow from bit line BL2, through the cell, into bit line BLB, through transistor SS1 to the grounded bit line BL1. Sense circuitry will detected the resultant change in voltage at the load connected to bit line BL2 thereby sensing the state of cell 10B.

The deselected word lines of the array are all grounded so that the cells of the deselected rows will remain non-conductive irrespective of programmed state. With respect to cell 10A in the selected row, this cell will remain non-conductive since both the drain and source of the cell are at ground potential. This is also true of the cells in the selected row to the left of selected cell 10A. Cell 10C will remain non-conductive since conductive transistor SS2 will cause both the source and drain to be at the same positive voltage. With respect to cell 10D, as previously noted, the deselected bit line BLN, with the exception of line BL1, are at the same positive potential as bit line BL2 so that both the drain and source of the cell are at the same potential as are the other cells in the row to the right of cell 10D. Thus, these deselected cells will remain non-conductive.

Programming of selected cell 10B is accomplished by bringing bit line BL2 to a positive voltage and grounding the remaining bit lines BLN through a high impedance load. A large positive voltage is applied to the selected word line WL2 and the deselected word lines are grounded. Again, select signal $\overline{S1}$ is made active and S1 inactive so that line BLB connected to the source of cell 10B is at ground potential and the drain connected to bit line BL2 is at a positive potential. This combination of voltages will cause cell 10B to be programmed. The cells in the deselected rows will not be programmed since the deselected word lines are all grounded. With respect to cell 10A in the selected row, the source and drain will be at the same low potential so that programming will not take place. Cell 10C will not be programmed because the drains and sources of the cells will be at the same high potential due to transistor SS2 being conductive. Cell 10D will have its source at a high potential and its drain presented with a high impedance to ground so that it will also not become programmed.

It can be seen that when successive memory cell reads take place, it is likely that one or more of the bit lines BLN will have to switch between high and low level states. Although the bit lines have a relatively low resistance by virtue of the overlying metal bit track connected in parallel, the bit lines extend over the full length of the array, interconnecting each of the array segments, including the relatively high capacitance of each cell of the array connected to the bit lines. Since, as previously noted, the time required to carry out read operations is the limiting factor in the overall speed performance of this type of read mostly memory, it can be seen that the AMG array speed is reduced.

The AMG array is capable of achieving a high cell density but suffers from a speed disadvantage due to the bit line capacitance previously described. A memory array which provides both the density of AMG arrays, but minimizes the speed shortcomings of such arrays would be highly desirable.

The present invention is directed to a flash memory system which addresses the above-noted shortcomings of conventional flash memory systems by providing the capability of erasing only two bits, a single byte or the entire array in one sequence. Further, the endurance of the cells 10 is enhanced by virtue of the fact that programming and erasing take place on substantially different locations on the cell. Further, bit line capacitance is reduced so that rapid reading can take place without resorting to high current and the concomitant large geometry cells. These and other advantages of the present invention will become apparent to those skilled in the art upon a reading of the following Detailed Description of the Invention together with the drawings.

SUMMARY OF THE INVENTION

An flash memory system which includes an array of floating gate memory cells, select means and control means is disclosed. The memory array includes at least one array segments, with each segment including alternating bit and source lines. Preferably, the bit and source lines are parallel lines implemented in the form of buried semiconductor lines, with the source line having an overlying metal line connected in parallel.

Each array segment further includes a multiplicity of rows, with each row including a word line and a first memory cell having a control gate connected to the word line. The first cell further includes a drain connected to a first one of the bit lines, a source connected to a first one of the source lines adjacent the first bit line. Each row further includes a second cell having a control gate also connected to the word line, a source connected to the first source line and a drain connected to a second bit line adjacent the first source line. In a typical application, there may be a very large number of cells located in one row, such as a thousand cells, together with associated source/bit lines.

The select means of the subject memory system is a means for selectively connecting a first node to one of the first and second bit lines. The first node is electrically isolated from the first source line. The select means is preferably implemented as a pair of transistors having a common terminal connected to the first node and respective remaining terminals connected to the first and second bit lines.

The control means of the subject memory system is a means for programming, erasing and reading cells of the memory array. Read means is provided for reading a selected cell by applying a positive first voltage, with respect to the source of the selected cell to the first node and by causing the select means to connect the first node to the bit line connected to the drain of the selected cell. The erase means is included for erasing at least two of the cells located in a given row by applying a second voltage to the word line associated with the two cells and for causing the select means to apply a third voltage to the common drain of the two cells, with the third voltage being positive with respect to the second voltage.

DETAILED DESCRIPTION OF THE INVENTION

Figure 1A:
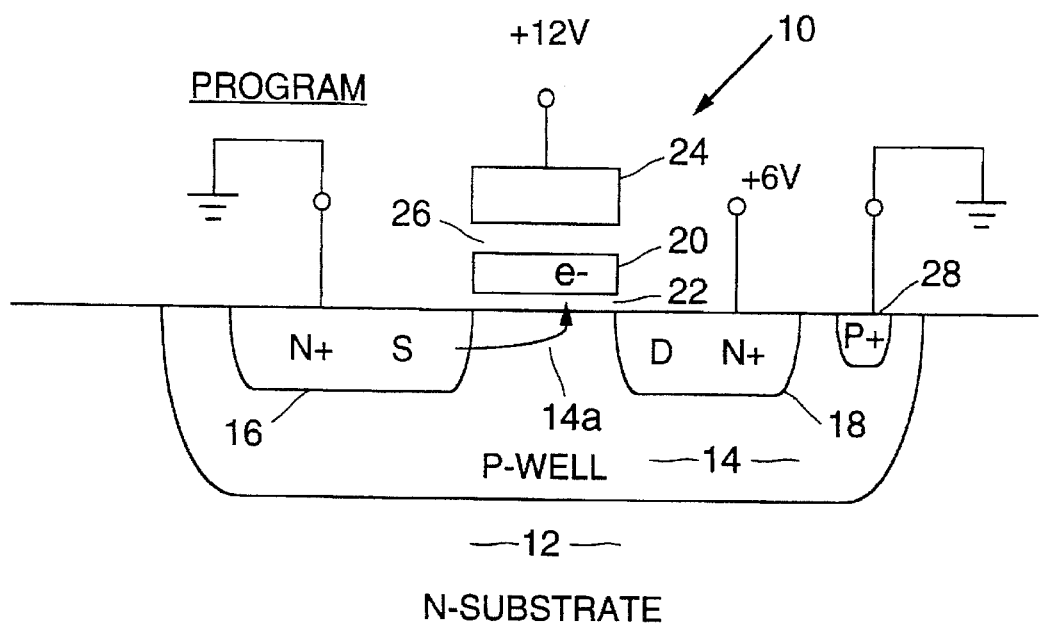
FIG. 1A is a simplified schematic diagram of a conventional flash memory cell and the associated voltages used in programming the cell.
Figure 1B:
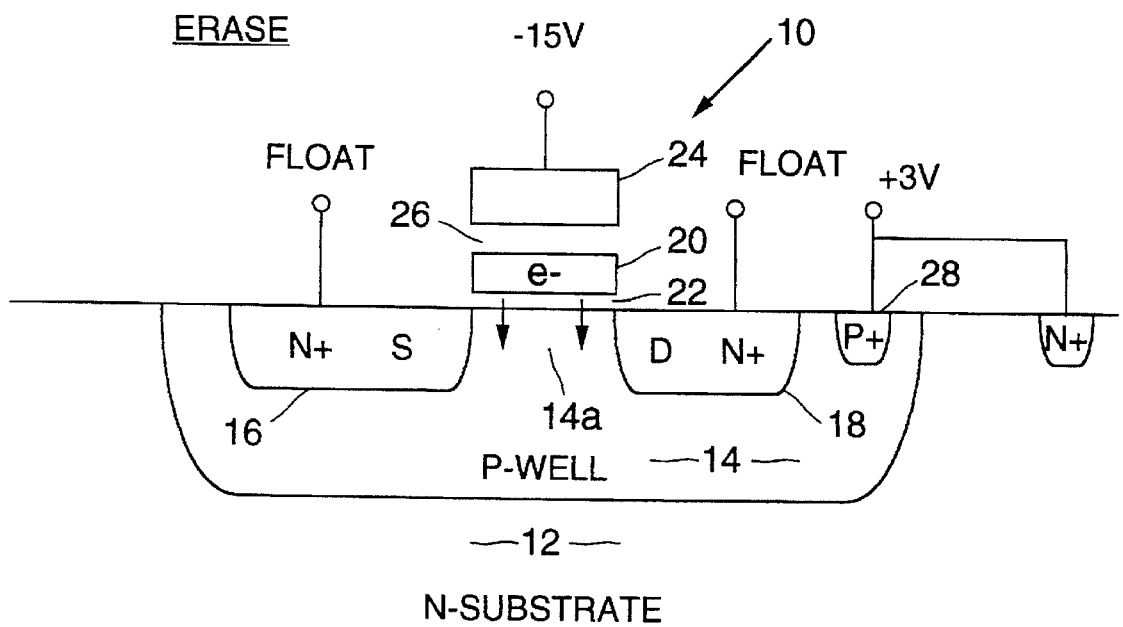
FIG. 1B is a simplified schematic diagram of the conventional flash memory cell of FIG. 1A and the associated voltages used in erasing the cell.
Figure 1C:
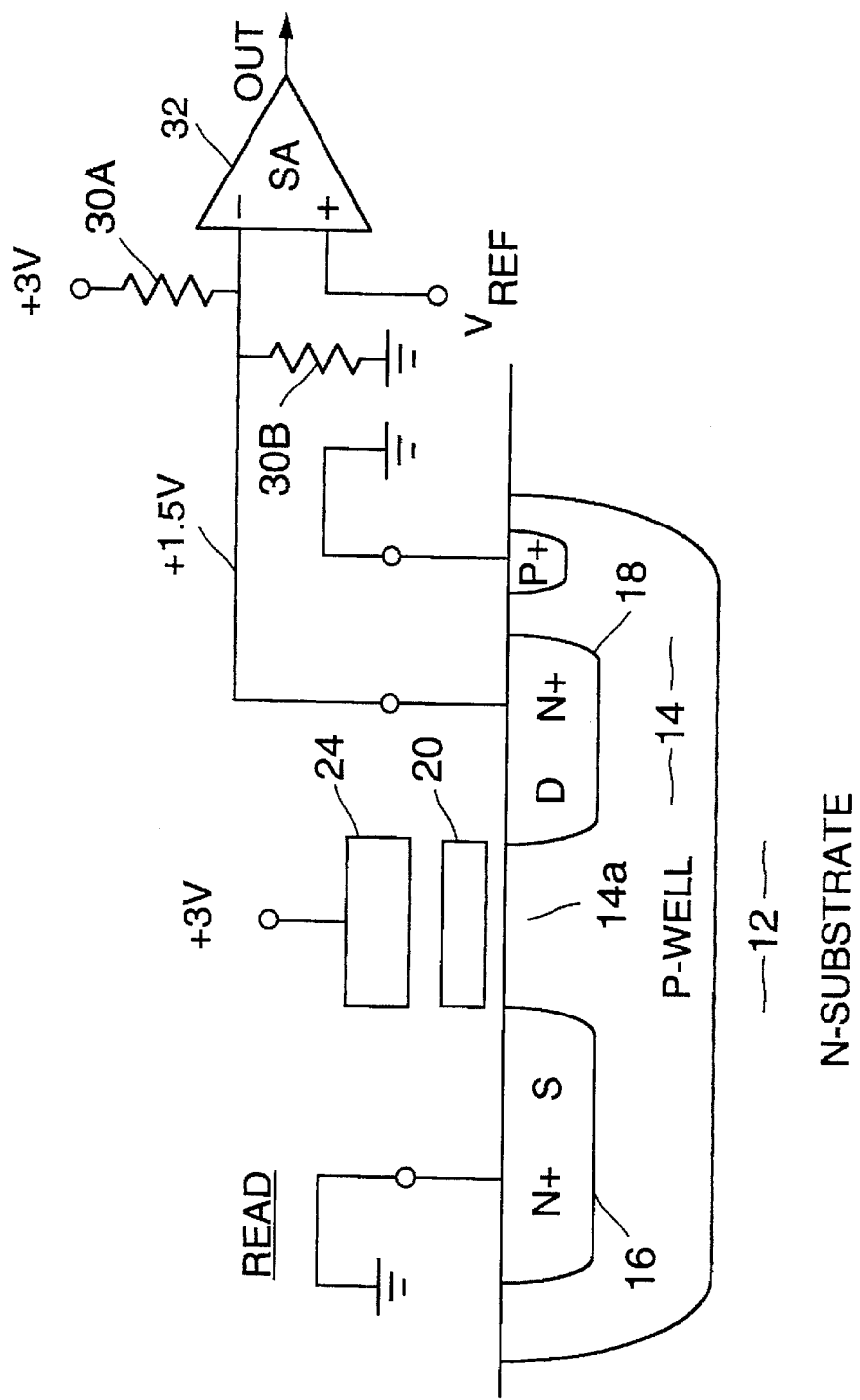
FIG. 1C is a simplified schematic diagram of the conventional flash memory cell of FIG. 1A and the associated voltages used in reading the cell.
Figure 2:
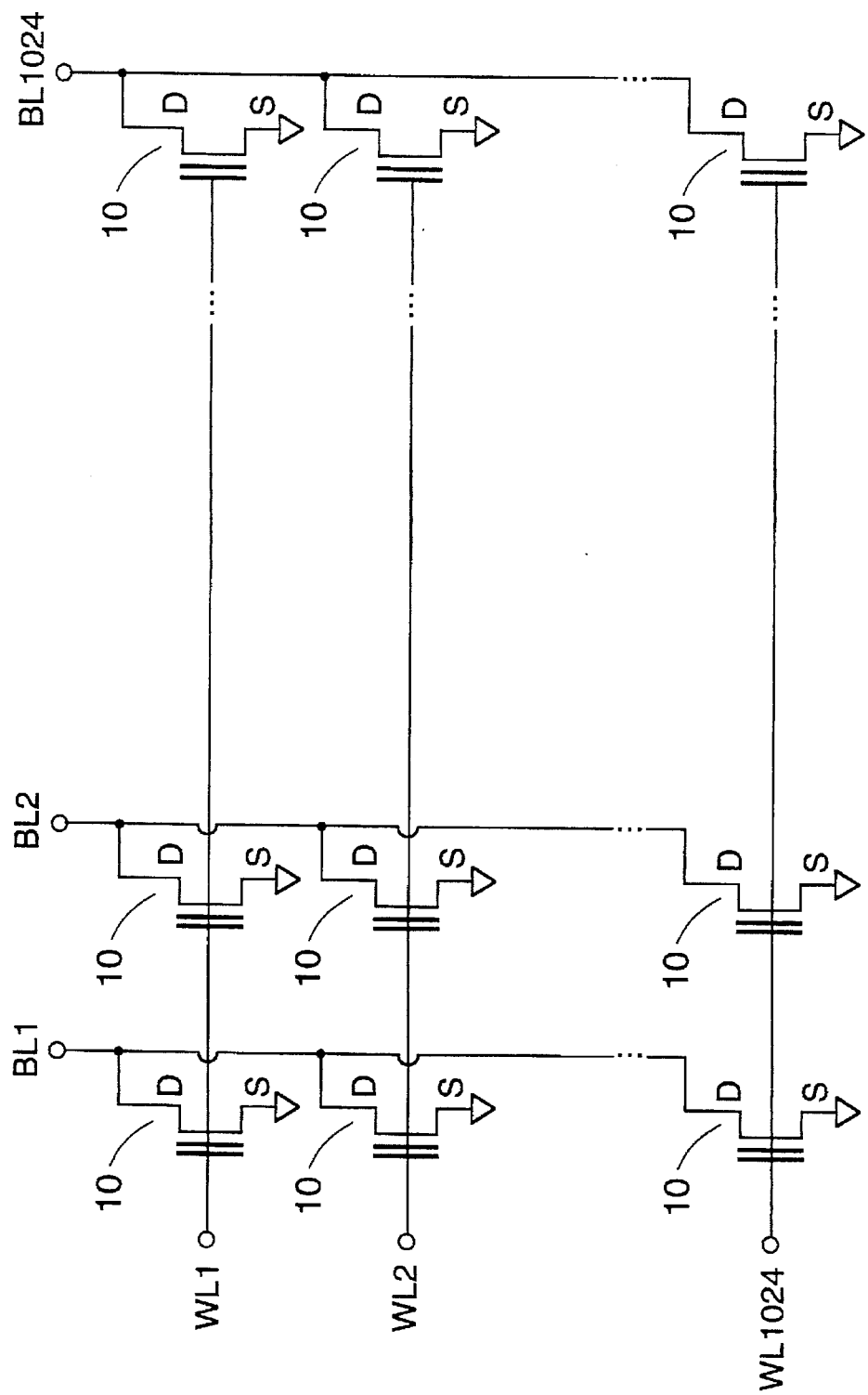
FIG. 2 is a diagram of a conventional memory array of flash memory cells.
Figure 3:
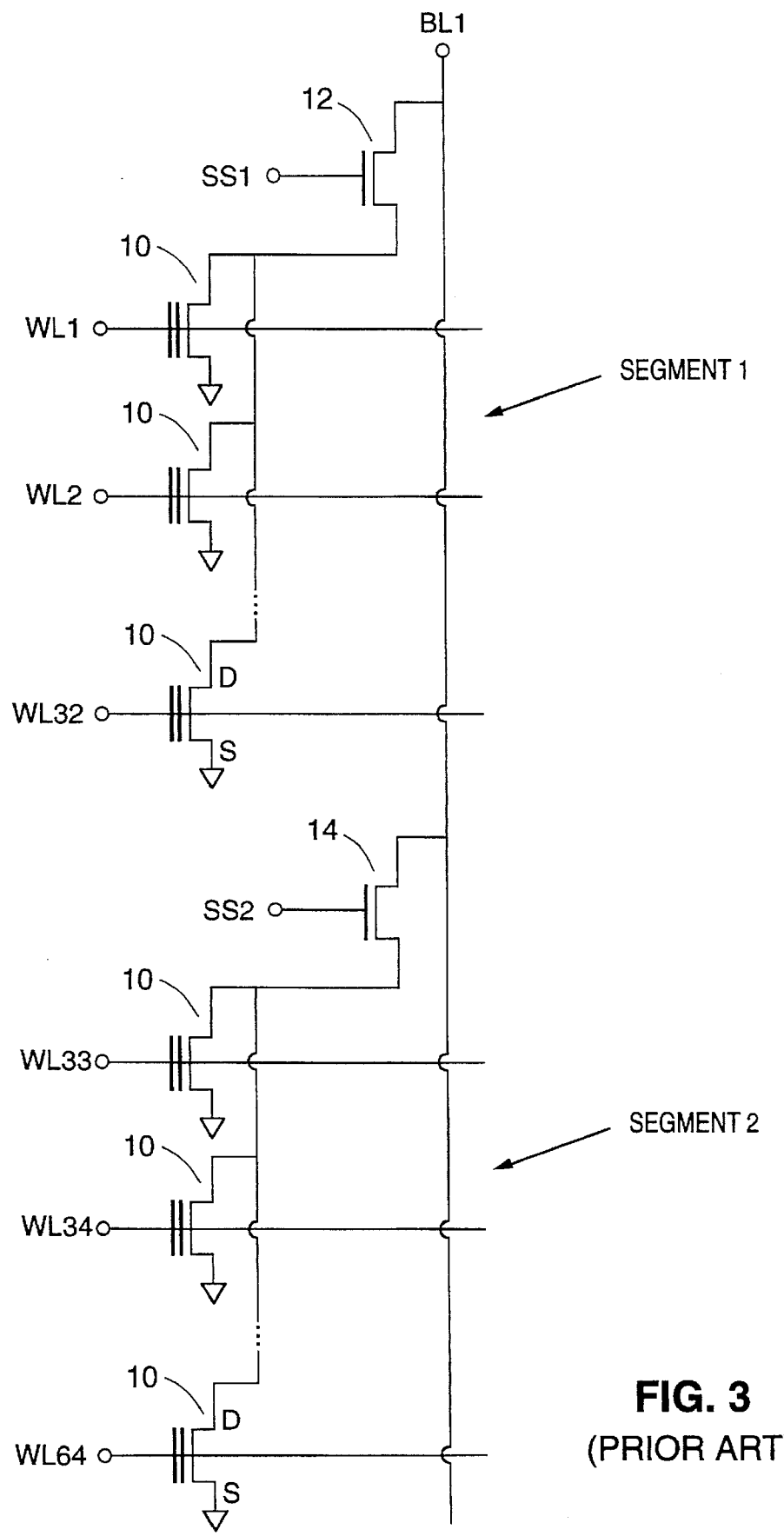
FIG. 3 is a diagram of a portion of a conventional segmented memory array of flash memory cells.
Figure 5:
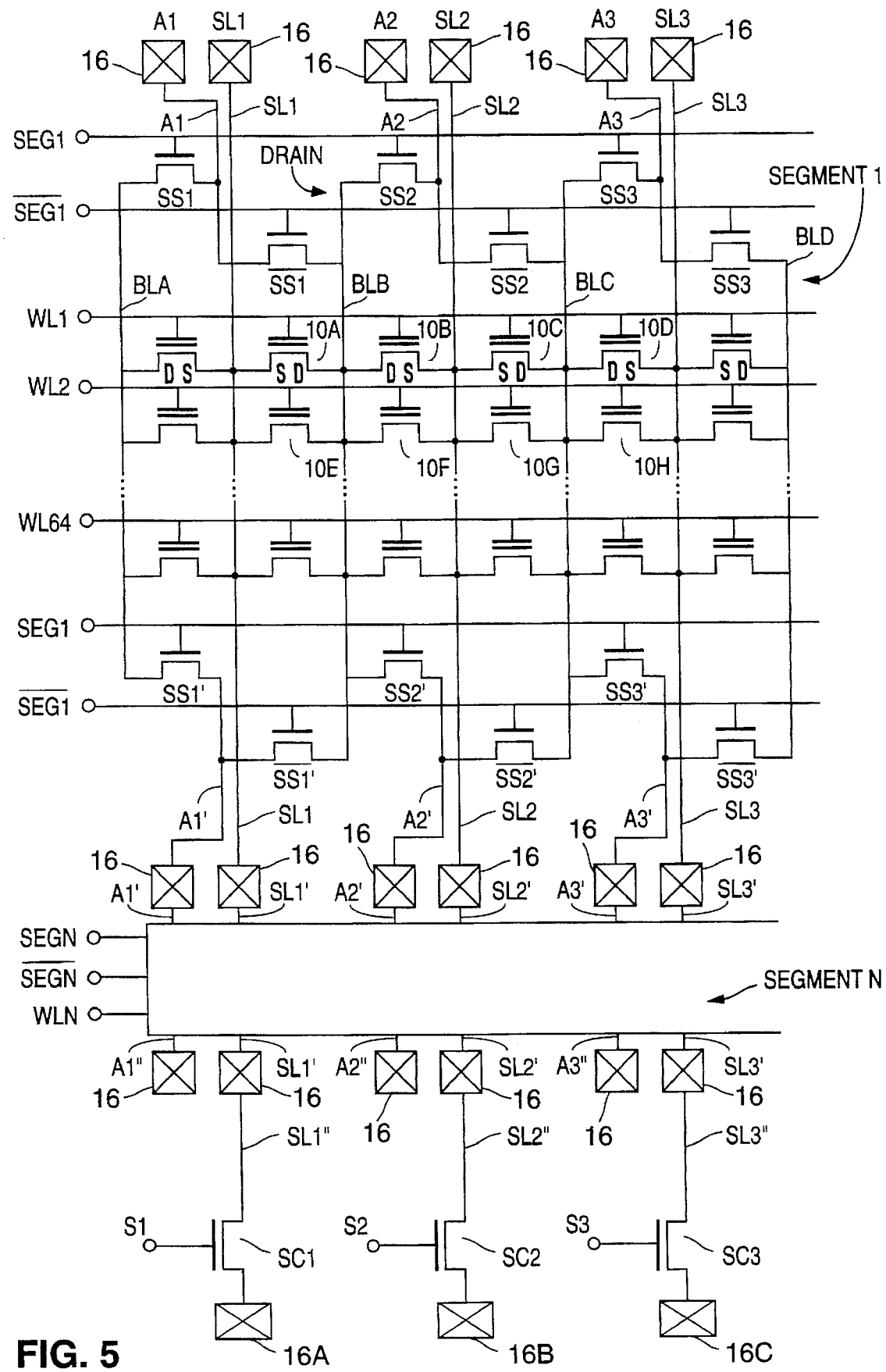
FIG. 5 is a diagram of a memory array of flash memory cells in accordance with the present invention.

Referring again to the drawings, FIG. 5 shows a memory array in accordance with the present invention. The subject array is a segmented array containing segments 1–N. Each segment includes a total of 64 rows of flash memory cells 10 which can be of the same type of N channel cells shown in FIGS. 1A–1C.

The cells 10 of the subject array are arranged in rows and columns, with each cell located in a particular row having its control gate connected to a common word line. The cells in a row are arranged in pairs, with the N type drain regions of the cell pairs being formed in common. For example, the cell pair 10A and 10B share a common drain region as do cell pair 10E and 10F located in the adjacent row. The N type drain regions of cells in a particular column are connected in common by a buried N type bit line, such as bit line BLB associated with cell pair 10A and 10B in one row and cell pair 10E and 10F in the adjacent row. Note that the bit lines BLN are relatively short and extend only the length of one segment of the array.

The cells of adjacent cell pairs have commonly formed source regions. By way of example, cells 10B and 10C have common N type source regions as do cells 10F and 10G in the adjacent row. The source regions of cells located in a particular column are connected to the source regions of cells in the same column by way of a buried N type diffusion which forms a common source line SLN associated with the column. By way of example, cells 10F and 10G have a common source region connected to the common source region of cells 10B and 10C by way of source line SL2.

Each segment N of the array includes a group of segment select transistors SSN and $\overline{SSN}$. The segment select transistors are arranged in pairs, with each pair having a common connection connected to a segment line AN. By way of example, select transistor pair SS1 and $\overline{SS1}$ have a common connection to segment line A1. The select transistor pairs are connected between adjacent bit lines BL. By way of further example, transistor pair SS1 and $\overline{SS1}$ are connected between bit lines BLA and BLB. The segment select transistors SSN and $\overline{SSN}$ are controlled by complementary segment select signals SEGN and $\overline{SEGN}$ which are, in turn, generated in response to address decoding circuitry (not depicted).

Each segment of the array preferably includes a second set of segment select transistors SSN' and $\overline{SSN}'$ located at the opposite side of the segment from segment select transistors SSN and $\overline{SSN}$. The bottom set of select transistors are controlled by the same segment select signals SEGN and $\overline{SEGN}$ as the first set. The bottom set of select transistors are arranged in pairs having a common connection to an associated segment line AN', each of which is connected to a contact 16. For example, transistors SS1' and $\overline{SS1}'$ are connected to segment line A1'. In addition, each pair of the bottom set of select transistors is connected between adjacent bit lines. The segment lines AN, AN' have overlying metal bit lines (not shown) connected between adjacent contacts 16 so that all of the segment lines associated with a single column of the array are electrically connected together.

The source lines SLN of an array segment are connected to the source line of each of the other segments of the array. By way of example, source line SL1 of Segment 1 is connected to source line SL1 of Segment N. There is a contact 16 to each source line for each segment of the array which contacts an overlying metal track (not depicted) connected in parallel with the buried source line.

Each source line SLN has an associated source control transistor SCN which is connected between the line and a contact 16N. By way of example, source line SL1 is terminated in source control transistor SC1. The source control transistors are controlled by signals SN. For example, transistor SC1 is controlled by signal S1.

The cells are programmed, erased and read in accordance with the conditions set forth in Table 1 below. A selected cell 10 is programmed by first deactivating all of the segment select signals SEGN in the segments in which the selected cell is not located. Thus, the segment select transistors SSN in these deselected segments will remain non-conductive. Next, the segment select transistor connected to the bit line associated with the cell to be programmed is turned on by the appropriate segment select signal SEGN. For example, assuming that cell 10B is to be programmed, signal SEG1 is made active and $\overline{SEG1}$ inactive. This will cause transistor SS2 to become conductive and connect the drain of cell 10B to segment line A2.

In addition, in order to program cell 10B, control circuitry will connect line A2 to ground. Thus, the drain of cell 10B will be grounded by way of transistor SS2, as indicated by Table 1. Further, signal S2 will be rendered active so that source select transistor SC2 will be turned on. Contact 16B is connected to a voltage of +7 volts so that the source line SL2 connected to the source of cell 10B will be at that voltage. The remaining source select transistors remain turned off so that the sources of the deselected cells are floating (F of Table 1). The selected word line WL1 is brought to a high voltage of +12 volts and the deselected word lines are grounded. Under the foregoing conditions, cell 10B will be programmed by hot electron injection predominantly in the region near the junction of the source and the channel region of the cell. Programming current will flow from line A2, through transistor SS2, through the cell and to the power supply by way of transistor SC2.

TABLE 1

|  | READ | PROGRAM | ERASE TWO BITS | ERASE BYTE | ERASE BLOCK |
|---|---|---|---|---|---|
| SELECTED WORD LINE | +3 | +12 | −10 | −10 | −10 |
| DESELECTED WORD LINE | 0 | 0 | 0 | 0 | −10 |
| SELECTED SOURCE LINE | 0 | +7 | 0 (BOTH) | 0 | 0 |
| DESELECTED SOURCE LINE | F | F | F | F | 0 |
| SELECTED BIT LINE | +1.5 | 0 | +5 | +5 | +5 |
| DESELECTED BIT LINE | F | F | F | +5 | +5 |

The cells 10 in the deselected rows will not be programmed since the associated word lines are grounded. Cell 10A will not be programmed since the associated source select transistor SC1 will be turned off. Further, cell 10C will not be programmed since that cell does not have a ground voltage applied to the drain because transistor $\overline{SS2}$ will be turned off.

One important advantage of the present invention is that it is possible to erase only two cells located in a given array row. For example, assume that cells 10A and 10B are to be erased. As indicated in Table 1, a negative voltage of −10 volts is applied to the selected word line WL1. The drains of cells 10A and 10B are connected to +5 volts by way of segment select transistor SS2 which is turned on by signal SEG1. The source of cell 10B is grounded by turning on source select transistor SC2 and the source of cell 10A is grounded by turning on source select transistor SC1. With these conditions, cells 10A and 10B will be erased by way of Fowler-Nordheim tunneling (cold electron injection), with the electrons being removed from the floating gates predominately in the area near the junctions of the drain and the channel regions. Since programming was accomplished by injection on the opposite side of the channel, the endurance of the memory is greatly enhanced.

A group of cells 10 sharing a common word line WLN can also be erased as opposed to only two cells. In that event and as indicated in Table 1, all of the source select transistors SCN are turned on so that all of the sources of all of the cells are grounded. In addition, a voltage of −10 volts is applied to the word line associated with the row of cells to be erased. Further, a voltage of +5 volts is applied to all of the drains of the cells. This is accomplished by applying that voltage to all of the pads 16 connected to the segment lines AN and turning on all of the segment select transistors SLN and $\overline{SSN}$. In order to turn on these transistors, both normally complimentary segment select signals SEG1 and $\overline{SEG1}$ must be at a high level. As also indicated in Table 1, all of the cells of a segment can be erased by applying −10 volts to all of the word lines of the segment rather than a single word line. The entire array can be erased in a similar manner.

Read operations are carried out by applying a positive voltage, typically +1.5 volts, to the segment line AN associated with the cell to be read. For example, if cell 10B is to be read, +1.5 volts will be applied to line A2. In addition, signal SEG1 is made active so that the positive voltage will be applied to the drain of cell 10B. Contact 16B is grounded by the control circuitry. Further, the source of cell 10B is connected to ground by operation of signal S2 which renders transistor SC2 conductive. Finally, a positive voltage of +3 volts is applied to the selected word line WL1 and the deselected word lines are grounded.

Figure 4:
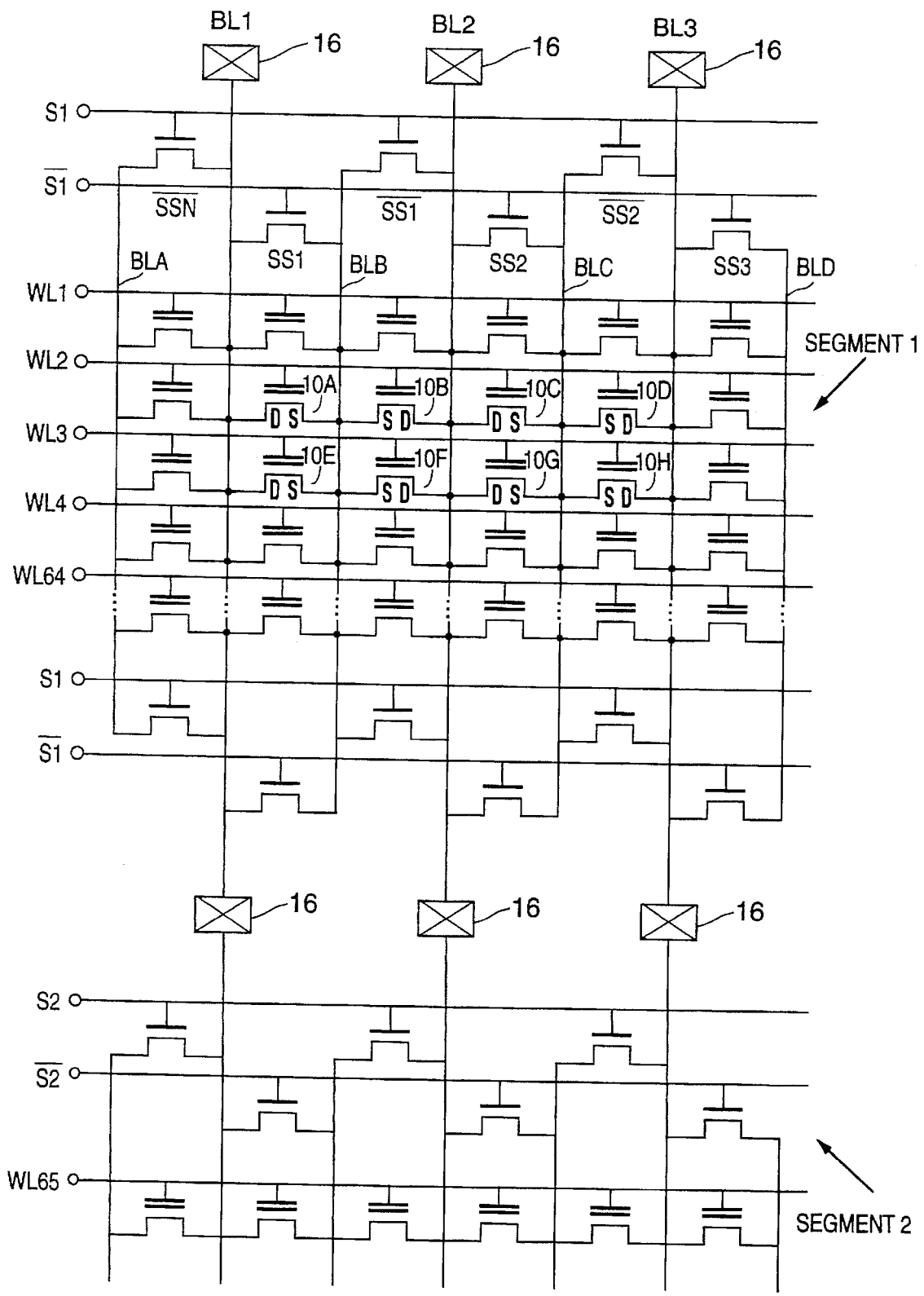
FIG. 4 is a diagram of a conventional alternate metal virtual ground (AMG) memory array of EPROM memory cells.

It is important to note that when successive memory read operations take place, the selected bit lines BL are switched between ground and a positive voltage (+3 volts). However, the length of the bit line is limited to the selected segment and does not extend the full length of the array as does the conventional AMG array, such as shown in FIG. 4. Thus, the speed of successive memory read operations is not inhibited by a long bit line connected to a large number of cell drains.

Note that the source lines SLN of the subject array extend the full length of the array. However, since these lines remain at ground potential during successive read operations, the large capacitance associated with the source lines does not reduce the speed of memory operation. On the contrary, the large capacitance of the source lines actually function to reduce noise on the line thereby increasing operation reliability. The fact that the source lines are switched in successive memory program operations does not reduce the overall speed of memory operations since flash memory devices are inherently orders of magnitude slower in program operations as compared to read operations and are, for that reason, used primarily for read mostly applications.

As an alternative method of programming, the function of the drain and source regions of the cells are reversed. For purposes of consistency, and as previously explained, the drain region of the subject N channel memory cells 10 is defined as that region of the cell connected to the most positive voltage during the cell read operations. Thus, using the alternative programming method, the drain of the cell to be programmed is connected to a positive voltage and the source is grounded. For example, if cell 10B is being programmed, line A2 is connected to a positive supply voltage and select transistor SS2 is rendered conductive by signal SEG1. Further, the source of the cell 10B is connected to ground voltage by connecting the ground voltage to contact 16B and turning on transistor SC2. This method of programming is not preferred since the endurance of the cells is reduced.

Figure 6:
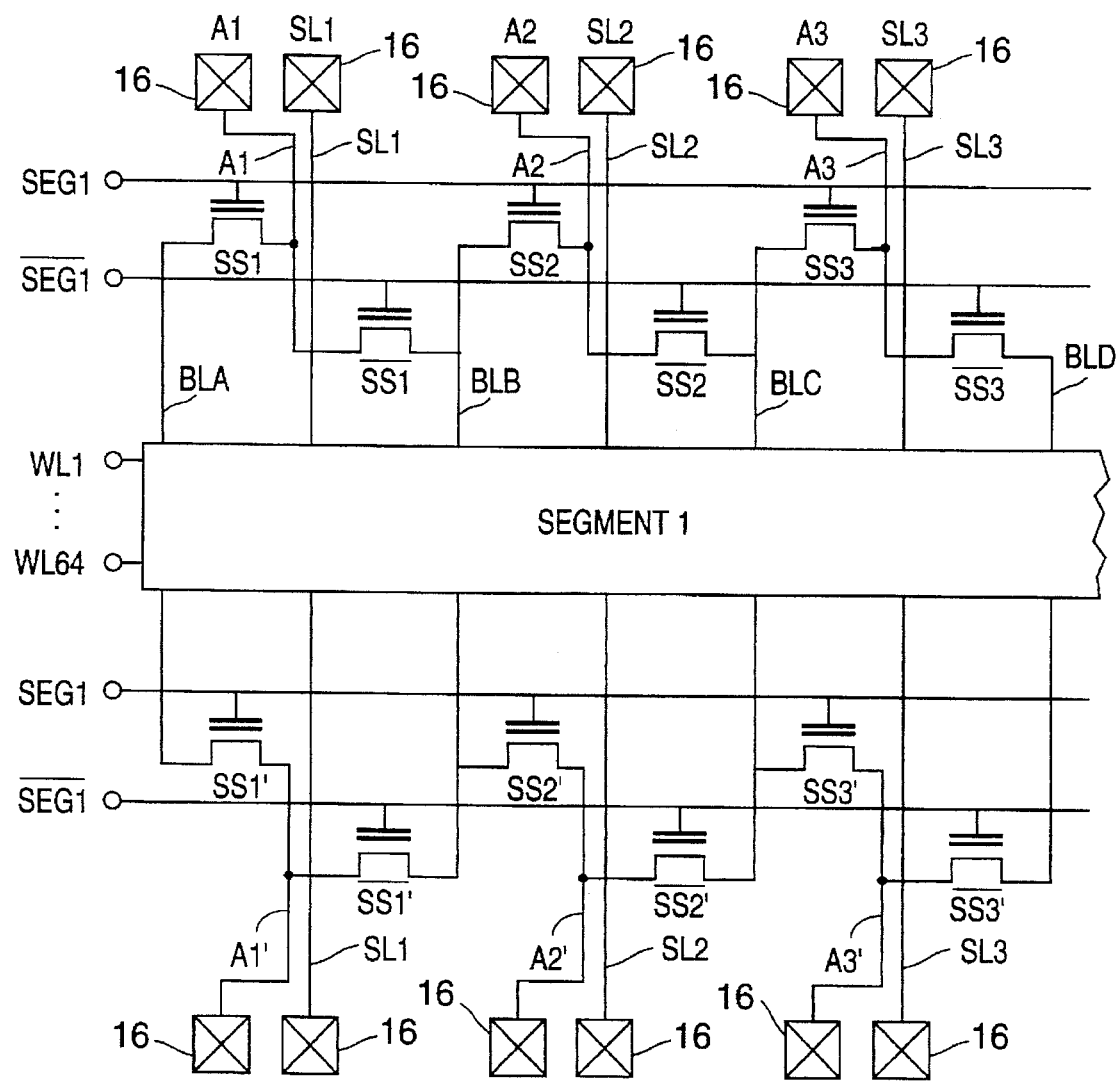
FIG. 6 is a diagram of a portion of an alternative memory array in accordance with the present invention showing double polysilicon segment select transistors.

If the second described programming method is used, the select transistors SSN are preferably conventional single poly MOS transistors as shown in FIG. 4 as are the source select transistors SCN. Double poly transistors, such as the transistors used in the memory cells 10, and which are erased to a low threshold voltage state, should not be used since the relatively large programming voltage applied to double poly select transistors will have a tendency to program the transistors to an undesired high threshold state. However, in the first programming method, the select transistors SSN are not required to conduct the large programming voltage. Thus, the select transistors SSN can be either single poly transistors as shown in FIG. 5 or double poly transistors erased to a low threshold voltage state as shown in FIG. 6. In the event double poly select transistors SSN are used, the fabrication process can be simplified by locating the single poly source select transistors SCN outside the memory array. In that event, no single poly devices need be located inside the memory array.

Figure 7:
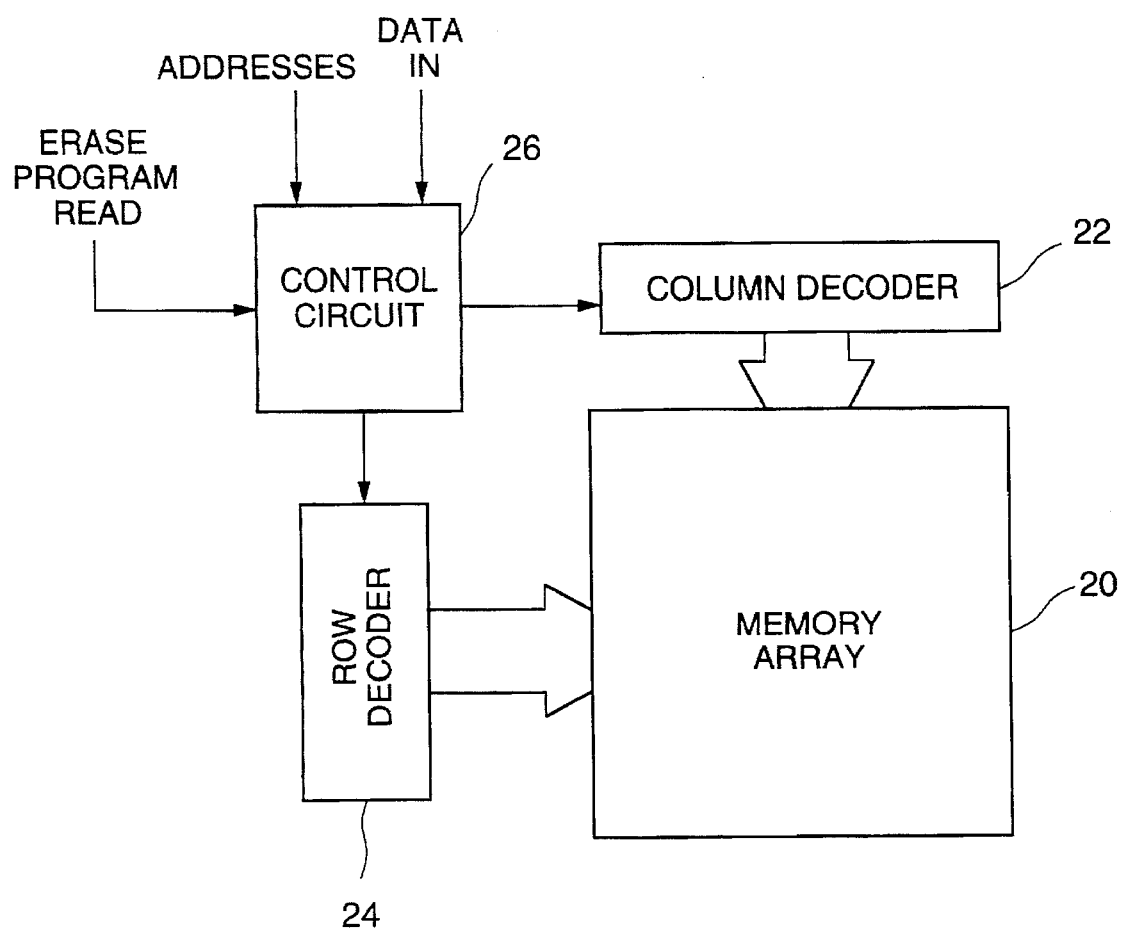
FIG. 7 is a simplified block diagram of a memory system which can be implemented in accordance with the present invention.

FIG. 7 shows a simplified block diagram of the overall memory system. The system includes a memory array 20 which includes the various array segments. The circuitry for decoding addresses for memory read, erase and program operations includes a Column Decoder 22. Column decoder 22 comprises the source control transistors SCN together with the appropriate voltages to be applied to the source and bit lines during program, erase and read operations. The exact magnitude of these voltages is dependent upon the characteristics of the particular memory cell 10 being used and are equivalent to those used in a conventional AMG array.

The system also includes Row Decoders 24 for decoding addresses for memory read and program operations together with the appropriate voltages to be applied to the word lines during read, erase and program operations. Again, the voltage magnitudes are dependent on the characteristics of the particular cell 10 being used. Both the Row and Column Decoders 22, 24 are controlled by a Control Circuit block 26 which generates the appropriate control signals SEGN, $\overline{\text{SEGN}}$, SN and related signals for carrying out both read and program operations. The particular implementation of the Column and Row Decoders and the Control circuit is readily apparent to those skilled in the art and forms no part of the present invention. Accordingly, details of such implementation will not be disclosed so as to avoid obscuring the true nature of the present invention in unnecessary detail.

One further advantage of the disclosed memory array is that much of the technology associated with conventional AMG arrays, such as the memory cell 10 structure, can be used. Also, since the disclosed alternating metal bit line architecture is very similar to that of conventional AMG arrays, essentially the same layout can be used. For this reason, it is unnecessary to include a description of the actual physical layout of the disclosed architecture or the peripheral control circuitry for generating and applying the appropriate voltages for programming, easing and reading the cells in order to practice the subject invention. These details are well known to those skilled in the art and familiar with conventional AMG devices. In addition, details of the fabrication of the subject memory array will not be disclosed since the fabrication process for implementing the subject invention is conventional and forms no part of the subject invention.

Thus, a novel flash memory system has been disclosed. Although a preferred embodiment has been described in some detail, it is to be understood that certain changes can be made by those skilled in the art without departing from the spirit and scope of the invention as defined by the appended claims.

I claim:

1. A flash memory system comprising:

a plurality of memory segments, each memory segment comprising:

a plurality of source bit lines;

a plurality of drain bit lines arranged so that one drain bit line is formed between each adjacent pair of source bit lines;

a plurality of flash memory cells arranged in rows and columns so that in each row of memory cells one cell is formed between each adjacent pair of source and drain bit lines, each of the cells having a source connected to one of the source bit lines, a drain connected to one of the drain bit lines, a channel disposed intermediate the source and drain so as to create a source-channel junction and a drain-channel junction, a floating gate disposed over and insulated from the channel and a control gate disposed over and insulated from the floating gate, the control gate being connected to one of a plurality of word lines;

a plurality of intermediate drain bit lines electrically isolated from the source bit lines;

a plurality of select transistors formed in a pair of rows so that, in each row of select transistors, one select transistor corresponds with every other column of memory cells, and so that, in the pair of rows, one select transistor corresponds with each column of memory cells, each of the select transistors having a first terminal connected to one of the drain bit lines, a second terminal connected to one of the intermediate drain bit lines, and a gate connected to one of a plurality of word lines; and control means for programming, reading and erasing the memory cells, the control means including program means for programming a selected memory cell by electron injection predominately near a first one of the source-channel junctions and drain-channel junctions, erase means for erasing the memory cells by cold electron injection predominately near a second one of the source-channel junctions and drain-channel junctions, and read means for reading a selected cell by application of a first voltage to the drain of the selected cell, the voltage being positive with respect to a voltage on the source of the selected cell.

2. The flash memory system of claim 1 wherein the program means programs the selected cell by application of a second voltage to a word line associated with the gate of the selected cell, and a third voltage to the source of the selected cell, with the second and third voltages being positive with respect to a voltage on the drain of the selected cell so that electron injection takes place predominately near the source-channel junction.

3. The flash memory system of claim 1 wherein the erase means erases a plurality of memory cells in a row of cells by application of a second voltage to the drains of the cells to be erased and a third voltage to a word line associated with the cells to be erased, with the second voltage being positive with respect to the third voltage so that cold electron injection takes place predominately near the drain-channel junction of the cells to be erased.

4. The flash memory system of claim 1 wherein each memory segment further includes a pair of select lines corresponding to the pair of rows of select transistors such that the gate of each select transistor in a first row of select transistors is connected to a first select line, and such that the gate of each select transistor in a second row of select transistors is connected to a second select line.

5. The flash memory system of claim 4 wherein the read means produces a first select signal and a second select signal which is the complement of the first select signal, with the first select signal being applied to the first select line and the second select signal being applied to the second select line associated with the memory segment in which the cell to be read is located.

6. The flash memory system of claim 5 wherein the drain bit lines of a first memory segment are electrically isolated from the drain bit lines of a second memory segment.

7. The flash memory system of claim 6 wherein the source bit lines of the first memory segment are connected to the source bit lines of the second memory segment.

8. The flash memory system of claim 7 wherein the source bit lines include buried semiconductor bit lines which extend across all of the memory segments.

9. The flash memory system of claim 8 wherein a plurality of metal source lines are connected in parallel with the buried semiconductor source lines.

10. The flash memory system of claim 9 wherein the drain bit lines each comprise a buried semiconductor bit line.

11. The flash memory system of claim 7 wherein the read means includes means for grounding the source bit line, with respect to an array circuit common, connected to the selected cell.

12. The flash memory system of claim 11 wherein the read means applies a positive voltage to the drain of the selected cell by applying a positive voltage to the first terminal of a corresponding select transistor and causing the corresponding select transistor to become conductive.

13. The flash memory system of claim 12 wherein the control means further includes a plurality of source transistors connected to the plurality of source bit lines that extend across all of the memory segments so that a source transistor is connected to each source bit line so that each source bit line has a state which can be selectively controlled utilizing the source transistor.

14. The memory system of claim 13 wherein the read means functions to cause the source bit line associated with the selected cell to be grounded with respect to the circuit common.

15. The flash memory system of claim 3 wherein the erase means erases two cells in a row of cells by applying the second voltage to the intermediate drain bit line connected to the select transistor associated with the two cells to be erased, and by applying a fourth voltage having a magnitude smaller than that of the second voltage to the remaining intermediate drain bit lines.

16. The flash memory system of claim 15 wherein the fourth voltage includes a circuit common potential.

17. The flash memory system of claim 3 wherein the erase means applies the second voltage to the plurality of intermediate drain bit lines so that the plurality of cells within the row of cells are erased.

18. The flash memory system of claim 1 wherein each source bit line of each of the memory segment is connected to a corresponding source bit line in an adjacent memory segment so that each source bit line runs through all of the memory segments.

19. The flash memory system of claim 18 wherein the drain bit lines of a memory segment are electrically isolated from the drain bit lines of an adjacent memory segment.

20. The flash memory system of claim 18 wherein the control means further includes a plurality of source transistors connected to a plurality of voltage sources and the plurality of source bit lines that extend across all of the memory segments so that each source bit line is independently connectable to a voltage source via a source transistor.

* * * * *